United States Patent
Xu et al.

(10) Patent No.: US 11,003,737 B2
(45) Date of Patent: May 11, 2021

(54) GENERIC HIGH-DIMENSIONAL IMPORTANCE SAMPLING METHODOLOGY

(71) Applicant: Samsung Electronics Co., Ltd., Suwon-si (KR)

(72) Inventors: Nuo Xu, Milpitas, CA (US); Jing Wang, San Jose, CA (US); Zhengping Jiang, San Jose, CA (US); Woosung Choi, Pleasanton, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 579 days.

(21) Appl. No.: 15/696,150

(22) Filed: Sep. 5, 2017

(65) Prior Publication Data

US 2018/0300288 A1 Oct. 18, 2018

Related U.S. Application Data

(60) Provisional application No. 62/484,850, filed on Apr. 12, 2017.

(51) Int. Cl.
| | |
|---|---|
| *G06F 17/18* | (2006.01) |
| *G01R 31/28* | (2006.01) |
| *G06F 17/14* | (2006.01) |
| *G06F 7/62* | (2006.01) |
| *G01R 31/317* | (2006.01) |

(52) U.S. Cl.
CPC ......... *G06F 17/18* (2013.01); *G01R 31/2851* (2013.01); *G06F 7/62* (2013.01); *G06F 17/141* (2013.01); *G06F 17/147* (2013.01); *G01R 31/31718* (2013.01)

(58) Field of Classification Search
CPC ........ G06F 17/18; G06F 7/62; G01R 31/2851
See application file for complete search history.

(56) References Cited

U.S. PATENT DOCUMENTS

| | | |
|---|---|---|
| 8,155,938 B2 | 4/2012 | Singhee et al. |
| 8,374,839 B2 | 2/2013 | Satoh |
| 8,806,418 B1 | 8/2014 | Jallepalli et al. |
| 9,147,031 B2 | 9/2015 | Radens et al. |
| 9,483,602 B2 | 11/2016 | McConaghy et al. |
| 9,576,085 B2 | 2/2017 | Joshi et al. |

(Continued)

OTHER PUBLICATIONS

Choudhury et al, Multidimensional Filtering Using Combined Discrete Fourier Transform and Linear Difference Equation Methods, IEEE Transactions on Circuits and Systems, vol. 37, No. 2, Feb. 1990, pp. 223-231 (Year: 1990).*

2014/0215274 A1 * 7/2014 Joshi ........................ G06F 11/008 714/37

(Continued)

*Primary Examiner* — Lisa E Peters
(74) *Attorney, Agent, or Firm* — Lewis Roca Rothgerber Christie LLP

(57) ABSTRACT

A method of circuit yield analysis for evaluating rare failure events includes performing initial sampling to detect failed samples respectively located at one or more failure regions in a multi-dimensional parametric space, generating a distribution of failed samples at discrete values along each dimension, identifying the failed samples, performing a transform to project the failed samples into all dimensions in a transform space, and classifying a type of failure region for each dimension in the parametric space.

18 Claims, 7 Drawing Sheets

(56) References Cited

U.S. PATENT DOCUMENTS

2016/0063156 A1     3/2016    Joshi et al.
2016/0242690 A1*   8/2016    Principe ............ A61B 5/04012

OTHER PUBLICATIONS

Zhang, Xiao-Wei, et al., "Rare Event Simulation for a Generalized Hawkes Process", Proceedings of the 2009 Winter Simulation Conference, pp. 1291-1298.

Zhai, Y., et al., "A Novel Nonlinear State Estimation Technique Based on Sequential Importance Sampling and Parallel Filter Banks", Proceedings of the 2005 IEEE Conference on Control Applications, Toronto, Canada, Aug. 28-31, 2005, pp. 1606-1611.

S. O. Toh et al., "Characterization of Dynamic SRAM Stability in 45 nm CMOS," IEEE Journal of Solid-State Circuits, vol. 46, No. 11, pp. 2702-2712, Nov. 2011.

F. Gong, et al., "A Fast Estimation of SRAM Failure Rate Using Probability Collectives," Proc. ACM ISPD, pp. 41-47, 2012.

K. Katayama, et al., "Sequential Importance Sampling for Low-Probability and High-Dimensional SRAM Yield Analysis," Proc. IEEE/ACM ICCAD, pp. 703-708, 2010.

A. Ciccazzo et al., "An SVM Surrogate Model-based Method for Parametric Yield Optimization," IEEE Transactions on Computer-Aided Design of Integrated Circuits and Systems, vol. 35, No. 7, pp. 1224-1228, Jul. 2016.

Y. Suzuki, "Rare-Event Simulation with Markov Chain Monte Carlo," KTH M.S. Thesis, 44 pages, 2013.

E. Chen, et al., "Advances and Future Prospects of Spin-Transfer Torque Random Access Memory," IEEE Transactions on Magnetics, vol. 46, No. 6, pp. 1873-1878, Jun. 2010.

N. Xu, et al., "Physics-based Compact Modeling Framework for State-of-the-art and Emerging STT-MRAM Technology," IEEE International Electron Device Meeting (IEDM), pp. 735-738, 2015.

* cited by examiner

GENERIC HIGH-DIMENSIONAL IMPORTANCE SAMPLING METHODOLOGY

CROSS-REFERENCE TO RELATED APPLICATION(S)

The present application claims priority to and the benefit of U.S. Provisional Patent Application No. 62/484,850, filed on Apr. 12, 2017, the contents of which are incorporated herein by reference in its entirety.

FIELD

Some embodiments of the present disclosure relate generally to the analysis of integrated circuit (IC) yield including a method for improving efficiency and accuracy of importance sampling Monte Carlo (ISMC) simulations by reducing a number of simulations needed to identify and analyze one or more rare failure events affecting product yield, and a system for performing the same.

BACKGROUND

In the field of integrated circuit (IC) yield analysis, it has become increasingly challenging to evaluate very rare failure events (i.e., rarely occurring failure events) when many process variability sources exist (e.g., when more than 100 process variability sources exist). Such situations may be classified as high-dimensional problems, wherein a number of dimensions refers to a number of process variability sources in diverse circuits.

Different process variability sources may be due to, for example, dozens or hundreds of transistors in a representative cell corresponding to an electronic circuit whose yield is to be analyzed. Furthermore, each transistor may have a number of characteristics, wherein one or more characteristics of one or more transistors may greatly deviate from an intended form due to process variability.

As a more specific example, static random access memory (SRAM) dynamic performance specifications may be evaluated by testing practical circuit design simulations. To evaluate SRAM dynamic specifications, it may be necessary to include analysis of connections of an analyzed SRAM cell to unselected/dummy neighboring cells. The introduction of the neighboring cells to the analysis intrinsically leads to a high-dimensional problem, such that conventional importance sampling (IS) methods will not be sufficient to detect and identify very rare failure events, due to an inability to converge to stable, rare failure rates in an acceptable number of simulated samples.

Failure rates at "high-sigma" tails of a distribution (e.g., 6a or higher) are important, as an array demands billions of life cycles, and because failure of even only a few cells could be catastrophic. To ensure capture of an incredibly rare failure event at a simulation-based evaluation/validation stage, in practice, more than 1e11 standard Monte Carlo (MC) simulations may be required, which may strain a constant sampling budget.

Furthermore, existing IS methods are generally unstable and inaccurate due to "the curse of dimensionality," meaning that for any type of sampling, the accuracy or the coverage of the samples is inversely proportional to the number of dimensions/process variability sources to be analyzed. Given a constant number of samples, if the samples are spread in a very high-dimensional space, the basis of coverage will be very small. Also, surrogated models and other sampling approaches have proven to fail when analyzing a large number of dimensions, as they are generally unable to accurately detect the failure region.

As an additional example, for some emerging technologies, such as spin-transfer-torque magnetic random-access-memory (STT-M RAM), a very small initial magnetization angle between free and pinned layers (e.g., an initial angle that is approximately zero) results in intrinsic device write operation failures/write-error-rate ("WER"). Thus, conventional optimization methods for importance sampling (IS) function cannot be directly applied, as rare-failure regions cannot be captured using shifted or reshaped Gaussian sampling at high-sigma regions.

Accordingly, it may be useful to provide new methods for identifying rare failure events in a fewer number of simulated samples.

SUMMARY

Some embodiments of the present disclosure provide methods for improving importance sampling Monte Carlo simulation (ISMC) efficiency and accuracy, and systems for performing the same.

According to some embodiments, there is provided a method of circuit yield analysis for evaluating rare failure events, the method including performing initial sampling to detect failed samples respectively located at one or more failure regions in a multi-dimensional parametric space, generating a distribution of failed samples at discrete values along each dimension, identifying the failed samples, performing a transform to project the failed samples into all dimensions in a transform space, and classifying a type of failure region for each dimension in the parametric space.

The method may further include iteratively optimizing an importance sampling (IS) function to suppress unwanted impacts of each of the dimensions by dimension reduction.

A method of the optimizing may correspond to the type of failure region.

The method may further include determining whether convergence to rare failure rates occurs as a result of the optimizing of the IS function, and further iteratively optimizing the IS function until the convergence occurs.

The method may further include performing importance sampling MC to calculate a failure rate of an analyzed circuit.

The transform may include a discrete cosine transform (DCT), discrete sine transform (DST), or a discrete Fourier transform (DFT).

The classifying may include determining which of the dimensions is important based on signatures of the dimensions in transform space.

The classifying may include evaluating a second transform coefficient and a third transform coefficient of the transform corresponding to the failed samples.

The classifying may include determining whether the second transform coefficient and the third transform coefficient is larger, wherein the type of failure region is classified as a high-sigma failure type when the second transform coefficient is larger, and wherein the type of failure region is classified as a concentrated failure type when the third transform coefficient is larger.

According to some embodiments, there is provided a system for circuit yield analysis for evaluating rare failure events, the system including a processor, and a memory having instructions stored thereon that, when executed by the processor, cause the processor to perform initial sampling to detect failed samples respectively located at one or more failure regions in a multi-dimensional parametric space, to generate a distribution of failed samples at discrete values along each dimension, to identify the failed samples, to perform a transform to project the failed samples into all dimensions in a transform space, and to classify a type of failure region for each dimension in the parametric space.

The instructions, when executed by the processor, may further cause the processor to iteratively optimize an importance sampling (IS) function to suppress unwanted impacts of each of the dimensions by dimension reduction.

The instructions, when executed by the processor, may further cause the processor to iteratively optimize the IS function according to a classified type of failure region.

The instructions, when executed by the processor, may further cause the processor to determine whether convergence to rare failure rates occurs as a result of optimizing the IS function, and to further iteratively optimize the IS function until the convergence occurs.

The instructions, when executed by the processor, may further cause the processor to perform importance sampling MC to calculate a failure rate of the circuit.

The transform may include a discrete cosine transform (DCT), discrete sine transform (DST), or a discrete Fourier transform (DFT).

The instructions, when executed by the processor, may further cause the processor to classify the type of failure region by determining which of the dimensions is important based on signatures of the dimensions in transform space.

The instructions, when executed by the processor, may further cause the processor to classify the type of failure region by evaluating a second transform coefficient and a third transform coefficient of the transform corresponding to the failed samples.

The instructions, when executed by the processor, may further cause the processor to classify the type of failure region by determining whether the second transform coefficient and the third transform coefficient is larger, wherein the type of failure region is classified as a high-sigma failure type when the second transform coefficient is larger, and wherein the type of failure region is classified as a concentrated failure type when the third transform coefficient is larger.

According to embodiments, there is provided a method of circuit yield analysis for evaluating rare failure events, the method including performing a transform on an initial number of simulated samples to indicate a number of variability dimensions corresponding to an analyzed circuit, based on the transform, detecting ones of the variability dimensions having failed samples, classifying a failure type of each of the ones of the variability dimensions having failed samples, and based on the classifying, iteratively optimizing an importance sampling function for each of the ones of the variability dimensions having failed samples.

A method of the optimizing may correspond to the type of failure region.

BRIEF DESCRIPTION OF THE DRAWINGS

Some embodiments can be understood in more detail from the following description taken in conjunction with the accompanying drawings, in which.

DETAILED DESCRIPTION

Figure 1:
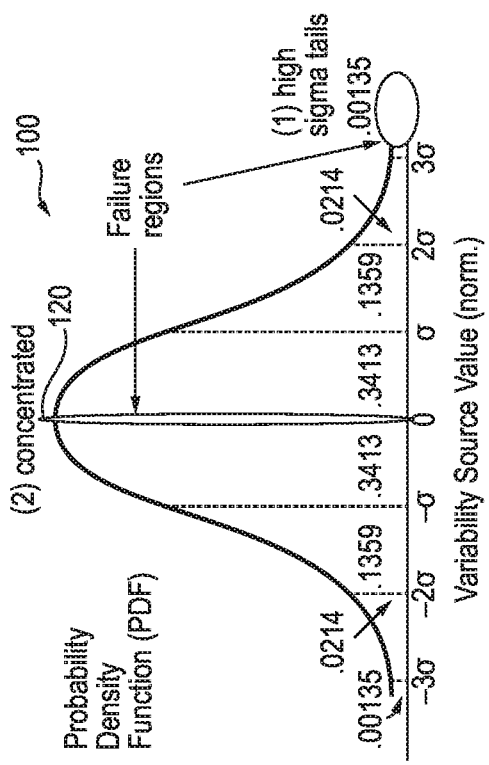
FIG. 1 is a probability density function indicating a concentrated failure region and a high-sigma tail failure region, according to an example for illustrating an embodiment of the present disclosure.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. In addition, it will also be understood that when an element or layer is referred to as being "between" two elements or layers, it can be the only element or layer between the two elements or layers, or one or more intervening elements or layers may also be present.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a probability density function indicating a concentrated failure region and a high-sigma tail failure region, according to an example for illustrating an embodiment of the present disclosure.

To generate the probability density function 100, first, $N_1$ uniformly distributed samples $\xi^j=(\xi_1^j, \ldots, \xi_M^j)$ $j=0, 1, \ldots, N_1$, are drawn from a given distribution function $N(\mu, \sigma)$, and MC simulations are run to identify samples occurring in failure regions (e.g., to identify failure samples) and to calculate the L2-norm values of the failure samples with reference to the mean. Then, one of the failed samples that has a minimum L2-norm is chosen as used as an initial shift vector of $\mu^1$.

Thereafter, $N_2$ samples are drawn from an initial parameterized distribution $h(\xi, \mu^1, \sigma^1)$, and the iteration index may be set at 2 (e.g., t=2).

Then, an indicator function $I(\xi^j)$ may be evaluated with the $N_2$ samples. Thereafter, the mean(s) and the sigma(s) may be calculated throughout the multiple dimensions of a parameterized space corresponding to the samples. The mean(s) and the sigma(s) may respectively be calculated by the following equations:

$$\mu_i^t = \frac{\sum_{j=1}^{N} I(\xi^j) \cdot \omega(\xi^j, \mu_i^{t-1}, \sigma_i^{t-1}) \cdot \xi^j}{\sum_{j=1}^{N} I(\xi^j) \cdot \omega(\xi^j, \mu_i^{t-1}, \sigma_i^{t-1})}; \text{ and}$$

$$\sigma_i^t = \sqrt{\frac{\sum_{j=1}^{N} I(\xi^j) \cdot \omega(\xi^j, \mu_i^{t-1}, \sigma_i^{t-1}) \cdot (\xi^j - \mu_i^t)^2}{\sum_{j=1}^{N} I(\xi^j) \cdot \omega(\xi^j, \mu_i^{t-1}, \sigma_i^{t-1})}}.$$

Then, another batch of N2 samples may be drawn from the updated parameterized distribution, and the iteration index, t, may be set as t+1 until convergence occurs (e.g., when the means and the sigmas are within an error tolerance).

Finally, $N_3$ samples may be drawn from the obtained optimal, or improved, sampling distribution $h(\xi,\hat{\mu},\hat{\sigma})$, and MC simulations may be run to identify failure samples. The failure probability may be expressed by the following equation:

$$P_r = \frac{1}{N_3} \sum_{j=1}^{N_3} I(\xi^j) \cdot \frac{\prod_{i=1}^{M} h(\xi_i^j)}{\prod_{i=1}^{M} h(\xi_i^j \cdot \hat{\mu}, \hat{\sigma})}.$$

Thereafter, a probability density function 100 may be generated to indicate failure regions (e.g., high-sigma tail failure regions 110 and concentrated failure regions 120), as shown in FIG. 1. However, an issue may exist at commonly recognized "rare" failure regions that are located at "high-sigma" tail regions 110 of a multivariate distribution (indicated by the probability density function 100) from process variability sources. For example, when failed samples distribute very narrow boundaries across a primary space (e.g., failed samples located in the concentrated region 120), then the failed samples need not appear in the high-sigma tail region 110 to be analyzed (assuming the failures are relatively concentrated). Furthermore, it may be difficult to have a sufficient number of samples from a region that contributes to the rare events failure.

As will be describe below, embodiments of the present disclosure provide a modified strategy for failures located at such "concentrated" regions, thereby improving IC-yield analysis. That is, an IS framework according to embodiments of the present disclosure can be used to more easily detect very rare failure events. As will be described below, the disclosed embodiments may generally include performing initial uniform sampling to roughly detect the failure region(s) (e.g., to detect which dimension, or which process variability, appears to exhibit a high rate of failure). Thereafter, concentrated sampling using a Gaussian distribution function analysis more closely focuses on the initially detected failure region(s). Finally, one or more parameter optimizations of resampling functions may be applied to determine a nominal case, such that relative waste can be calculated and identified, thereby enabling accurate capture of the relatively rare failure events, and improving efficiency and accuracy of importance sampling Monte Carlo (ISMC).

One contribution of embodiments of the present disclosure is the ability to perform transform-based filtering (e.g., discrete cosine transform (DCT) filtering, discrete sine transform (DST), and discrete Fourier transform (DFT) filtering) of a distribution function (e.g., probability density function 100) of a failed sample at each variability source dimension, to thereby determine which variability source dimensions are principal dimensions in affecting the circuit yield (e.g., the rare failure events). Accordingly, unwanted impacts of the dimensions may be suppressed during optimization or improvement of a corresponding IS distribution function, which may be referred to as a filter-based dimension reduction technique.

Another contribution of embodiments of the present disclosure provides the ability to classify a "failure type" for each variability dimension, based on coefficients under the transformed basis, into a "high-sigma tails" type or a "concentrated" type. That is, it may then be determined whether the failure types of the rare failure are due to high-sigma tails, or are due to some concentrated window occurring across the parametric space.

Yet another contribution of embodiments of the present disclosure is the ability to use iterative algorithms (e.g., probability collectives (PC)) to improve or optimize IS function along each variability dimension, and to apply appropriate constraints to each dimension according to their failure types.

Figure 2:
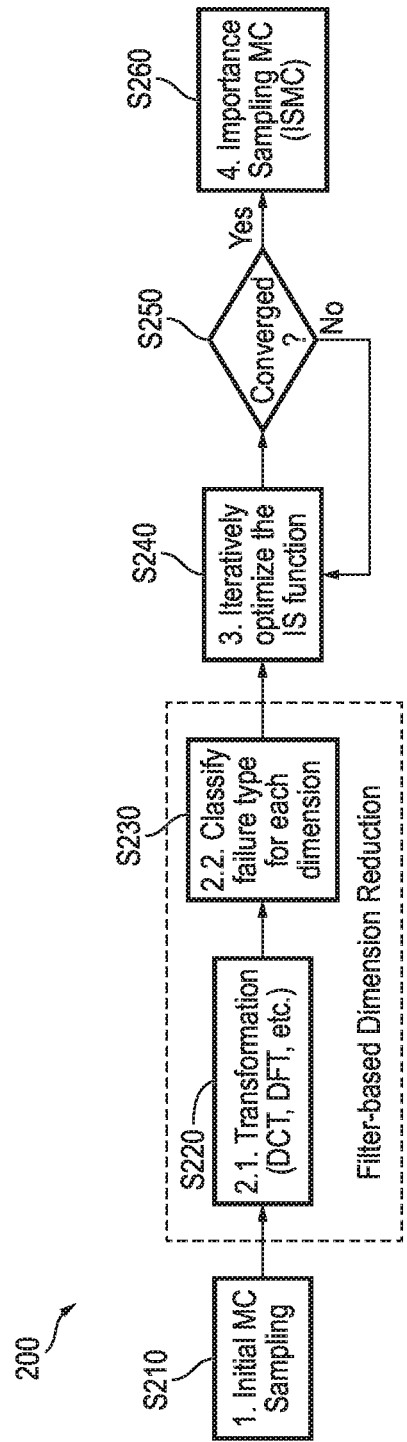
FIG. 2 is an overall flow chart for evaluating rare failure events, according to an embodiment of the present disclosure.

FIG. 2 is an overall flow chart for evaluating rare failure events, according to an embodiment of the present disclosure.

Referring to FIG. 2, initially, a uniform sampling operation may be performed (e.g., to cover an entirety of the multi-dimensional parametric space). That is, an initial MC sampling may be performed at S210 to detect failed samples. It should be noted that the sampling operation can be combined with advanced sampling techniques, such as classifier-assisted adaptive sampling, statistical blockade or Markov Chain MC methods, etc., and that the probability distribution function used for sampling can be uniform, Gaussian, or "shell/ring"-type. Thereafter, the failed samples may be identified and collected.

Then, some type of transformation may be performed upon the distribution on the collected failed samples at S220.

For example, a transform (e.g., a DCT/DST or DFT) may be performed on the failure probability distribution (e.g., probability density function 100 of FIG. 1) to indicate which dimensions may be important. In other words, there may be performed transformations of failed sample's distribution along each selected dimension (e.g., using DCT/DST, DFT, etc.) project coefficients from different distributions into a transform space.

Accordingly, the performed transformation enables relevant information regarding the failures to be collected, and enables a failure type for each dimension to be classified at S230. For example, information including the coefficient(s) from the transform results may be collected such that the failure type (e.g., "high-sigma tail" failed samples or "concentrated window" failed samples) for each dimension may be classified, and the importance of each classified dimension may be determined. That is, based on coefficients in the transformed domain, which dimension(s) is critical may be determined along with the corresponding failure type(s).

Operations S220 and S230 may be collectively viewed as the aforementioned filter-based dimension reduction technique. As described above, filter-based dimension reduction enables determination of which parameter(s) is non-critical to thereby determine the failure rate. The dimensionality reduction techniques can be applied onto the determined failure rates to reduce the MC variance at high dimensions while using only a reduced/limited number of samples.

Thereafter, different optimization strategies may be used for each type of failure upon each selected "important" failure dimension. That is, optimization may be iteratively performed on the IS function(s) at S240 based on information collected from performing the transformation upon the distribution of the failed samples. For example, different customized optimization may be performed on a case-by-case basis, and may be performed for reduced dimension cases, thereby enabling preservation of accuracy. The optimization of the IS distribution function(s) may be performed using probability collectives and/or other iterative algorithms, which may be based on each dimension's failure type.

Then, it may be determined whether convergence to rare failure rates occurs at S250. Upon convergence, the IS functions may be parameterized, and the final ISMC simulation may be performed at S260 to calculate the circuit failure rate.

Accordingly, by performing sampling, and by recalculating for each failed sample, there may be calculated a final, very rare failure rate. Furthermore, it should be noted that the disclosed embodiments are compatible with existing ISMC and other rare-events evaluation methods.

Figure 3:
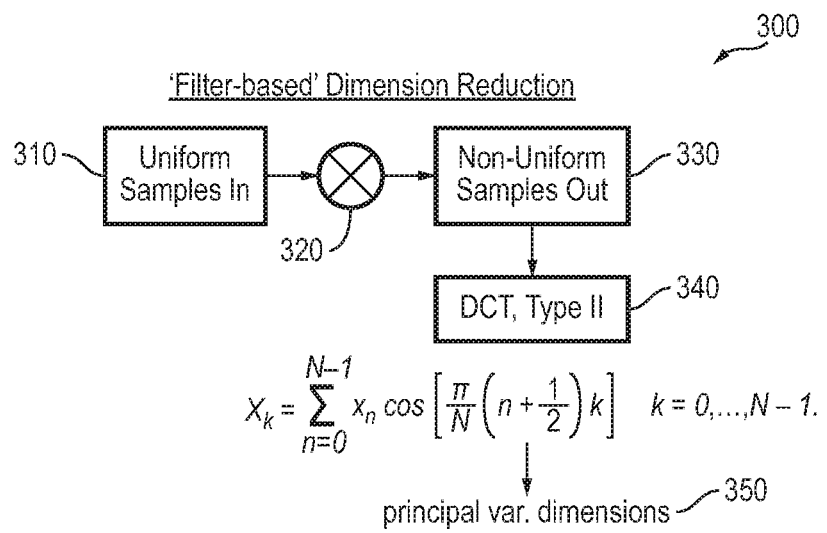
FIG. 3 is a block diagram depicting a filter-based dimension reduction technique, according to an embodiment of the present disclosure.

FIG. 3 is a block diagram depicting a filter-based dimension reduction technique, according to an embodiment of the present disclosure.

Referring to FIG. 3, in practical ISMC problems, dimension reduction improves the accuracy and stability of a given sampling because, typically, only a small portion of dimensions/process variability sources may be critical to affect failure rates of the analyzed circuit. As described above, after initial (e.g. uniform) sampling (e.g., S210), failed samples may be identified, and their distribution (at discrete values) along each dimension may be generated by transformation (e.g., S220), and classified as a particular failure type (e.g., S230).

In other words, and as shown in FIG. 3, uniform samples 310 are put through a "filter" 320 to generate non-uniform samples 330 comprising identified failed samples. The non-uniform samples may then be transformed 340 to thereby generate principal variability dimensions 350, which may then be analyzed to classify failure types of the relevant dimensions.

Figure 4:
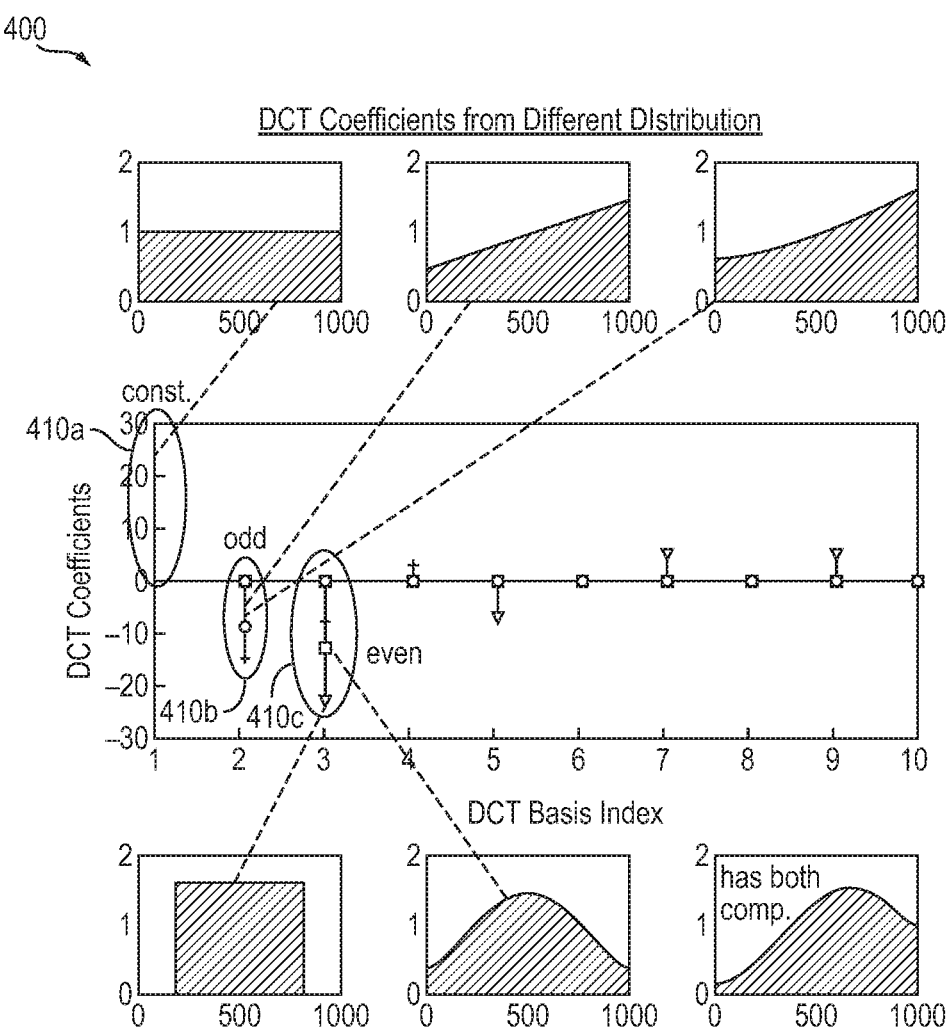
FIG. 4 depicts DCT coefficients from different distributions projected into a transform space, according to an example of an embodiment of the present disclosure.

FIG. 4 depicts DCT coefficients from different distributions projected into a transform space, according to an example of an embodiment of the present disclosure.

Referring to FIG. 4, by performing a DCT, DFT, or other type of transform for each distribution, latent components (e.g., components with odd and even symmetry) can be detected to indicate a type of a failure region in the parametric space (e.g., whether the failure region is a high-sigma tail region 110, or is a concentrated failure region 120, as shown in FIG. 1). That is, transformation may be performed on the collected failed samples to perform transformation of the distribution. Accordingly, in a manner similar to signal processing, the distribution of failed samples may be re-projected into the corresponding transform space 400, as shown in FIG. 4.

The described method may be robust to fluctuations that may occur during sampling and that may appear as high-frequency components. For DCT, the first three coefficients cover all of the information regarding the "selectivity" of a variability dimension. Thus, a low-pass filter may be implemented by only evaluating the second and third DCT coefficients to classify the failure types, and information may be collected as DCT coefficients from different distributions for all of their basis.

That is, a transformed signal projected into the transform space 400 corresponds to an energy distribution of the signal. Accordingly, the different DCT coefficients that from different distributions may be thought of as forming all of the components 410 of the signal. In the present example, the first component 410a, which corresponds to DCT basis index "1," is essentially a constant, background floor in the signal. Further, a second component 410b, which corresponds to DCT basis index "2," corresponds to a single-sided component of the signal (e.g., an odd symmetry function), while a third component 410c, which corresponds to DCT basis index "3," corresponds to a double-sided/even symmetric function. In the present example, the second and third components 410b and 410c each comprise high order harmonic components.

By performing the above described filter-based dimension reduction on the failed sample distribution, the degree to which each component contributes to the failed samples may be estimated, thereby indicating a relative portion of each off-signal basis component that contributes to the failed sample distribution. Accordingly, it may be determined which dimension/process variability source is important to the failure analysis. Because there is a constant occurring in the signal corresponding to the failed samples, by projecting all of the failed samples into all of the dimensions, it can be determined which dimension is important based on the signatures in the DCT, DST, or DFT domain (e.g., in the transformed space).

That is, based on the relative coefficients for each component, it may be determined whether the failure is due to high-sigma tails, or whether the failure is due to some concentrated window in the low or moderate sigma region. If there are failed samples at high-sigma tails, then the failed samples indicate a preference for one side. The high-sigma failed samples may be very negative or very positive, in which case the distribution of failed samples will show some single-sided, odd symmetry function. If the failed samples correspond to a very narrow window failure region (e.g., a low-sigma region), then the failure region will be close to the center (e.g., an even, symmetric function distribution), which is information that can be detected by the above-described analysis.

Figure 5:
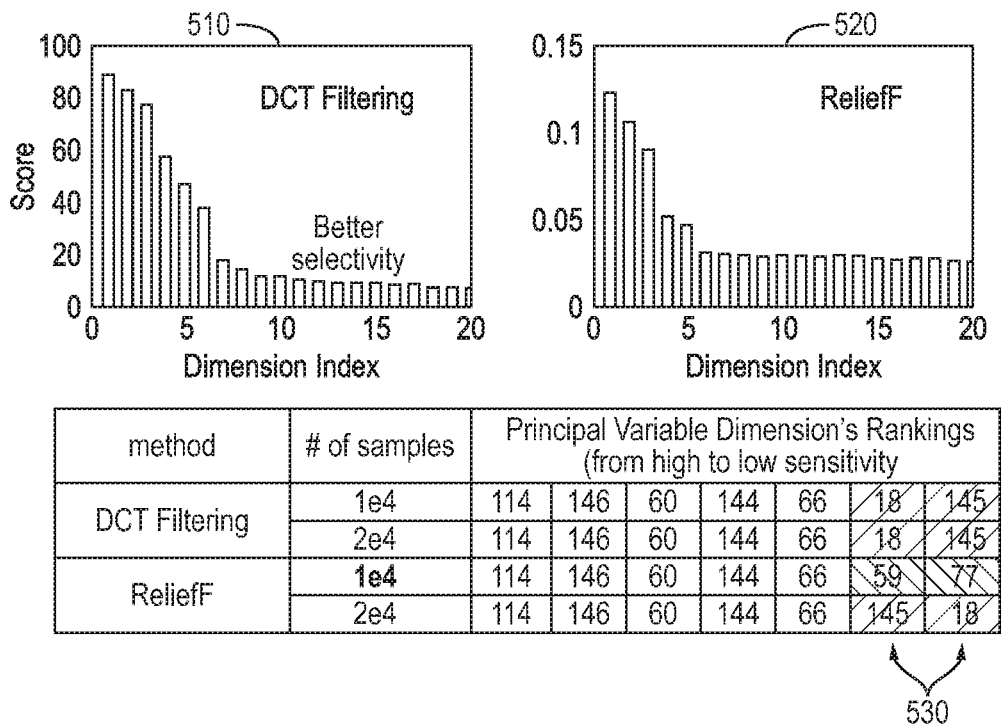
FIG. 5 depicts a filter-based dimension reduction technique according to an embodiment of the present disclosure, and a dimension reduction technique according to comparative example.

FIG. 5 depicts a filter-based dimension reduction technique according to an embodiment of the present disclosure, and a dimension reduction technique according to comparative example.

As described below, existing dimension reduction methods in data science/machine learning field are generally insufficient to accurately determine failure regions. For example, Principal Component Analysis (PCA) provides the examination of correlation among parametric dimensions. However, in most circuit simulation cases, the modeled variability sources are mutually independent, therefore it cannot help. That is PCA cannot be applied to the examples described herein, because for circuit simulation, an input level always has data including an independently identically distributed sample. However, PCA only works for correlated data, which may exist between two dimensions. Accordingly, although PCA can be used for dimension reduction, in the examples described herein, all of the dimensions are independent, and PCA cannot be used.

As another example, naïve parametric sensitivity check is impossible to define a "response surface" for high-dimensional, not smoothing functions, and also fails to provide intuitive regarding the failure type. Although naïve parametric sensitivity check works for examples dealing with some small perturbations around some nominal case, it cannot be applied to the examples described herein due to relatively have large variations in the input.

As an additional example, ReliefF is subject to variance at high dimensions with limited number of samples, but is not intuitive to classify failure type. Although ReliefF can be used to score each dimension to rank according to relative importance, it is unable to achieve the same degree of analysis achieved by the embodiments described herein.

Contrastingly, and according to the described embodiments, for a multiple-failure region, various hyper-distance criterions (L1/L2 or cosine) can be used to evaluate a number of potential failure regions that exist. Then, dimension reduction and IS function optimization can be applied for each failure cluster. Furthermore, IS function is not uniform, and the filtering mechanism can be changed to evaluating the relative change of DCT second and third components to determine their importance, and their corresponding failure type.

Referring to FIG. 5, a DCT filtering 510 according to an embodiment of the present disclosure behaves more robust than a ReliefF approach 520 when dealing with an insufficient number of samples. By performing a test on a pragmatic problem of real SRAM circuits with over 100 dimensions, the above principal variability dimension's rankings were obtained for differently sized samples using both the ReliefF approach 520, as a comparative example, and the DCT filtering method 510 according to an embodiment of the present disclosure.

As described above, uniform sampling was performed, and all of the failed samples were collected. Then, dimension selection or reduction was performed using both the DCT filtering technique of the present embodiment versus the iteration proposed ReliefF measure. To rank a score of each dimension from these two measures, a continuous reading is generated to convey all of the dimensions as they contribute different importance. Based on an analysis of the reading, some of the more important dimensions, as they relate to failed samples, may be isolated for further analysis.

As can be seen with respect to the ReliefF approach 520, following the fixed dimension, all of the remaining dimensions have roughly the same score, making the remaining dimensions relatively indistinguishable. However, in the present example, the important dimension is modified. Accordingly, the correct selection of all of the important dimensions is unable to be accomplished using ReliefF 520.

In the present example, 10,000 samples and 20,000 samples were performed with respect to both the ReliefF approach 520, as a comparative example, and the DCT filtering method 510 according to an embodiment of the present disclosure. Unlike the ReliefF approach 520, the DCT filtering method 510 according to the present embodiment showed consistent future dimensions capture results regardless of whether sufficient or insufficient samples were used (e.g., whether 10,000 samples or 20,000 samples were used). The ReliefF approach 520, however, indicated that once the sample was reduced by half (e.g., from 20,000 samples to 10,000 samples), fluctuations could be seen on the selected dimensions (e.g., as indicated by the contrast between the principal variability dimension's rankings for the last two columns 530). Furthermore, in the present example, closer inspection of the two fluctuated dimensions selected (corresponding to the last two columns 530) as they relate to a final circuit (e.g., whether fabricated or simulated) indicated that the dimensions did not have any physical meaning. However, the proposed dimension selection can still be worked for the problem by using the DCT filtering method 510 of the present example.

To further improve ISMC accuracy, dimension reduction may be applied. Dimension reduction will "eliminate" a non-principal dimension's variability during an optimization operation until a final IS operation, which again uses the original sampling distribution. However, following dimension reduction, the overall failure rate(s) may be underestimated in many typical cases.

Below provides a solution for achieving more accurate estimations of the overall failure rates. For example, as a solution for compensating underestimation of failure rates, the Bayesian chain rule may be applied such that initial samples, which may be represented by the following equation $$Pr(\xi \in \Omega_{Fail}^R | \xi \in \Omega_{Fail}) = \frac{\sum_i w(\xi_i) I(\xi_i^R)}{\sum_i w(\xi_i)}$$

which may be used to produce the following equation $$Pr(\xi \xi \Omega_{Fail}^R) = Pr(\xi \xi \Omega_{Fail}^R | \xi \xi \Omega_{Fail}) \cdot Pr(\xi \xi \Omega_{Fail})$$

Further, a criterion can be applied to constrain the confidence (e.g., $\Omega_{Fail}$) above a certain threshold value.

Figure 6:
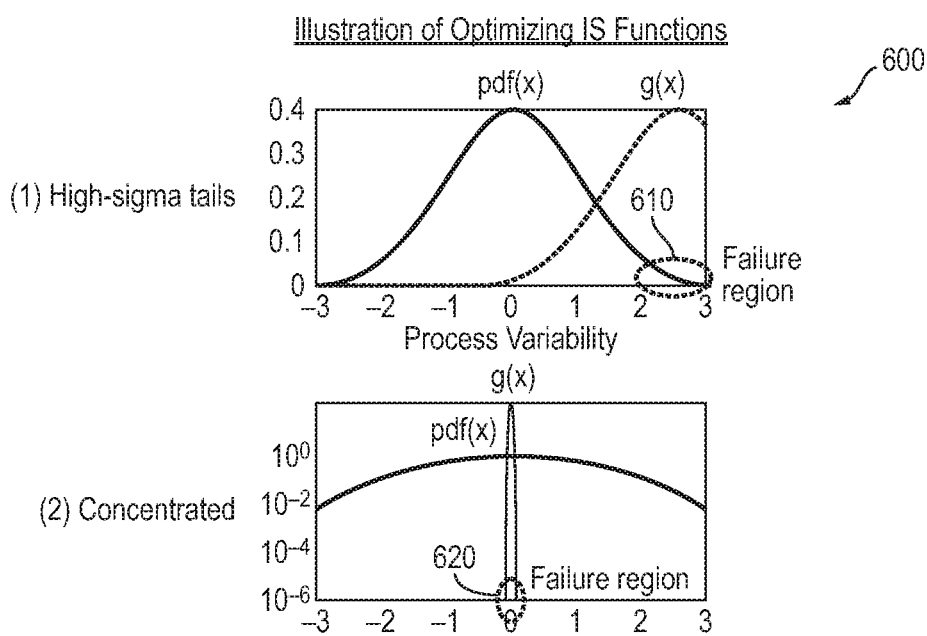
FIG. 6 depicts optimization of importance sampling functions, according to an embodiment of the present disclosure.

FIG. 6 depicts optimization of importance sampling functions, according to an embodiment of the present disclosure.

Referring to FIG. 6, a generic IS function may also be optimized, according to an embodiment of the present disclosure. By using a dimension reduction technique, the parametric space for a sampling can be largely reduced (e.g., reduced to less than 10 dimensions), thereby facilitating ISMC methods. An initial probability distribution function pdf(x) may be optimized to generate an optimized IS distribution function g(x).

For example, if a failure region is detected, but the failure doesn't appear in a high-sigma tail region, the methodology of the present embodiment may shape the Gaussian function into a high-sigma region. That is, although conventional methods are unable to shape a Gaussian function into a high-sigma region when a failure region does not take place in a high-sigma tail, by using information collected from DCT transformation and DCT filtering, according to embodiments described herein, it can be determined which DCT transform coefficient is largest.

If it is determined that the second DCT transform coefficient is larger, then it may be assumed that a high-sigma failure problem exists (e.g., indicates a high-sigma tail failure region 610). However, if it is determined that the third DCT transform coefficient is larger, then it may be assumed that the failure problem is more likely to be a concentrated failure region problem (e.g., indicates a concentrated failure region 620).

In the present embodiment, the failure rate may be determined by the following equation:

$$\int I(x) \frac{pdf(x)}{g(x)} g(x) dx$$

where I(x) is an indicator (e.g., 0 or 1), pdf(x) is an original distribution, and g(x) is an optimized (IS) distribution.

Accordingly, at a $t^{th}$ iterative step, for the $i^{th}$ dimension, the following equations apply:

$$\mu_i^t = \frac{\sum_{j=1}^{N} I(\xi^j) \cdot \omega(\xi^j, \mu_i^{t-1}, \sigma_i^{t-1}) \cdot \xi^j}{\sum_{j=1}^{N} I(\xi^j) \cdot \omega(\xi^j, \mu_i^{t-1}, \sigma_i^{t-1})};$$

$$\sigma_i^t = \max\left(\sqrt{\frac{\sum_{j=1}^{N} I(\xi^j) \cdot \omega(\xi^j, \mu_i^{t-1}, \sigma_i^{t-1}) \cdot (\xi^j - \mu_i^t)^2}{\sum_{j=1}^{N} I(\xi^j) \cdot \omega(\xi^j, \mu_i^{t-1}, \sigma_i^{t-1})}}, \sigma_{c,i}\right),$$

where $\sigma_{i,0}$ is from the original $i^{th}$ variability dimension; and $$\sigma_i^t = \max\left(\sqrt{\frac{\sum_{j=1}^{N} I(\xi^j) \cdot \omega(\xi^j, \mu_i^{t-1}, \sigma_i^{t-1}) \cdot (\xi^j - \mu_i^t)^2}{\sum_{j=1}^{N} I(\xi^j) \cdot \omega(\xi^j, \mu_i^{t-1}, \sigma_i^{t-1})}}, \sigma_{c,i}\right),$$

where $\sigma_{c,i}$ is a critical value for $i^{th}$ variability dimension, where $\sigma_{c,i}$ may be calculated by isolating all other variability dimensions, and by performing a binary search for the $i^{th}$ dimension caused failure rates.

For example, for each case (e.g., high-sigma tail failure regions and concentrated failure regions), each case may be optimized separately. For a conventional high-sigma failure problem, the resampling function may be optimized. Contrastingly, for a concentrated failure region problem, an iteration may be performed based on the failed samples, and some boundaries confining the failed samples may be set. Thereafter, the resampling function may be optimized such that the failed samples within the failure window are targeted, and concentrated sampling may be performed within that window, thereby improving sampling accuracy when compared with conventional MC sampling.

Accordingly, the classified failure types will guide how to optimize the IS function for each principal dimension.

Figure 7:
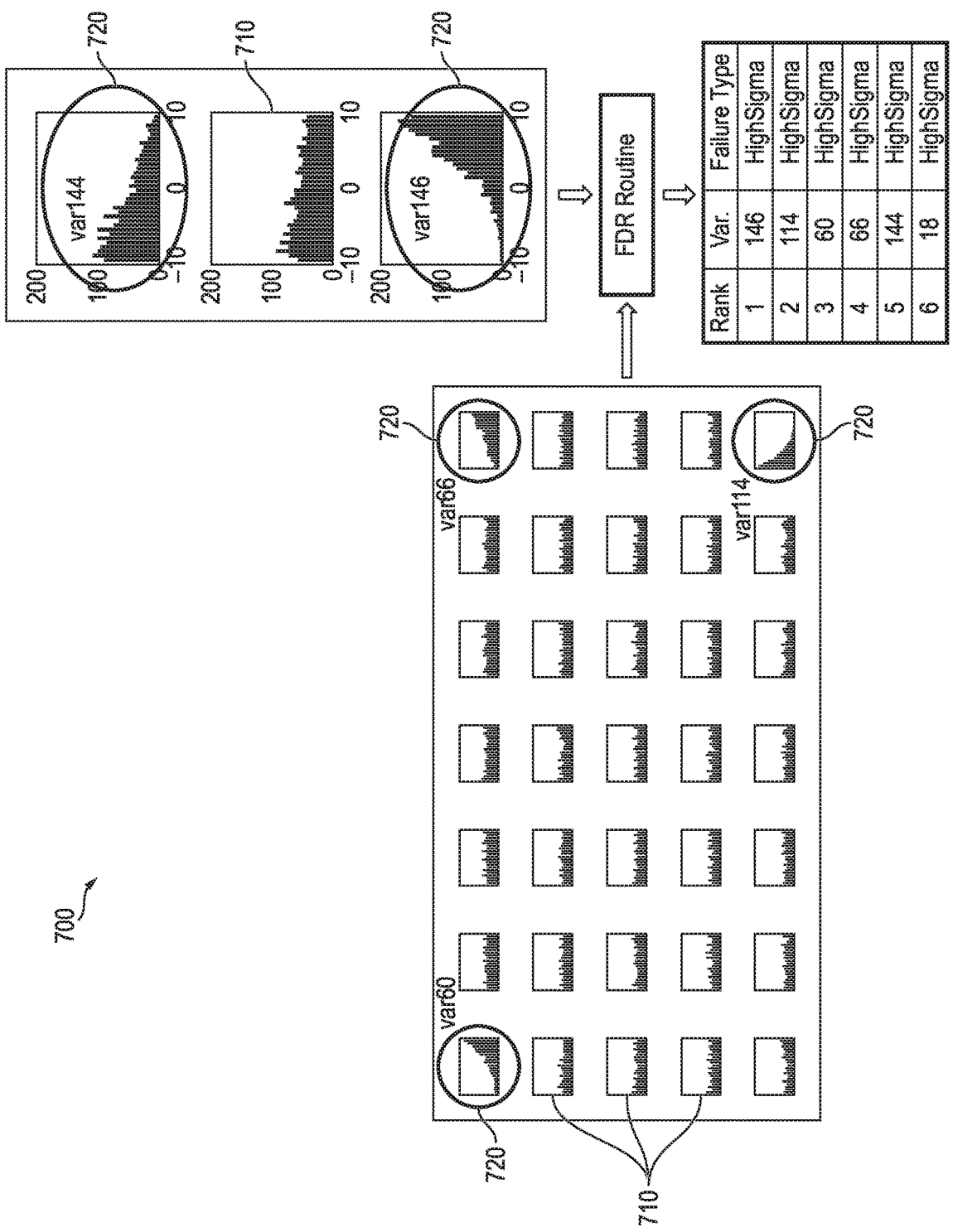
FIG. 7 depicts an example of an analysis of an SRAM array dynamic write failure, according to an embodiment of the present disclosure.

FIG. 7 depicts an example of an analysis of an SRAM array dynamic write failure, according to an embodiment of the present disclosure.

Referring to FIG. 7, process variability (e.g. random dopant fluctuations, RDF and line-edge roughness, LER) induced transistor performance (e.g. threshold voltage, Vth) mismatch has been considered as a main cause for SRAM yield loss. In advanced technology nodes, dynamic Read and Write operations may be used as failure criterions, which are proved to be more accurate than static specs.

Simulation in the present example evaluates a 24-SRAM block (e.g., a total of 144 transistors) with global and local variability sources, and BSIM-CMG compact models are used for transistors. Some of the dimensions not indicating a failure (e.g., dimensions 710) along with some of the dimensions indicating a failure region (e.g., important dimensions 720 corresponding to process variability dimensions 60, 66, 114, 144, and 146), which are generated according to an embodiment of the present disclosure, are shown in the chart 700. In the present example, each of the important dimensions 720 indicates high-sigma tail failure regions.

That is, in the present example, some of the failed sample distributions across all 147 dimensions of the present example are shown. For a majority of the dimensions, the failed samples distribute relatively uniformly (e.g., dimensions 710 show neither high-sigma nor concentrated window failures). That is, the majority of dimensions do not indicate a preference of a certain latitude fail.

However, some of the variability dimensions 720 shown in FIG. 7 behave differently when compared to the majority of the dimensions, as they indicate a preference of the distribution of the failed samples. That is, when a greater number of failed samples occur at a certain side of a corresponding graph (e.g., to the left for negative high-sigma failures, or to the right for positive high-sigma failures), then the analysis indicates that those corresponding samples are more likely to fail. Accordingly, these dimensions may be collected by doing DCT transformation to thereby generate a quantized signature of distribution and function.

Accordingly, the present example identifies six important dimensions 720, and each of the important dimensions 720 is given a relative rank. Although all of the dimensions in the present example are identified as high-sigma fails, it should be noted that dimensions in other examples may be identified as concentrated window fails.

Figure 8:
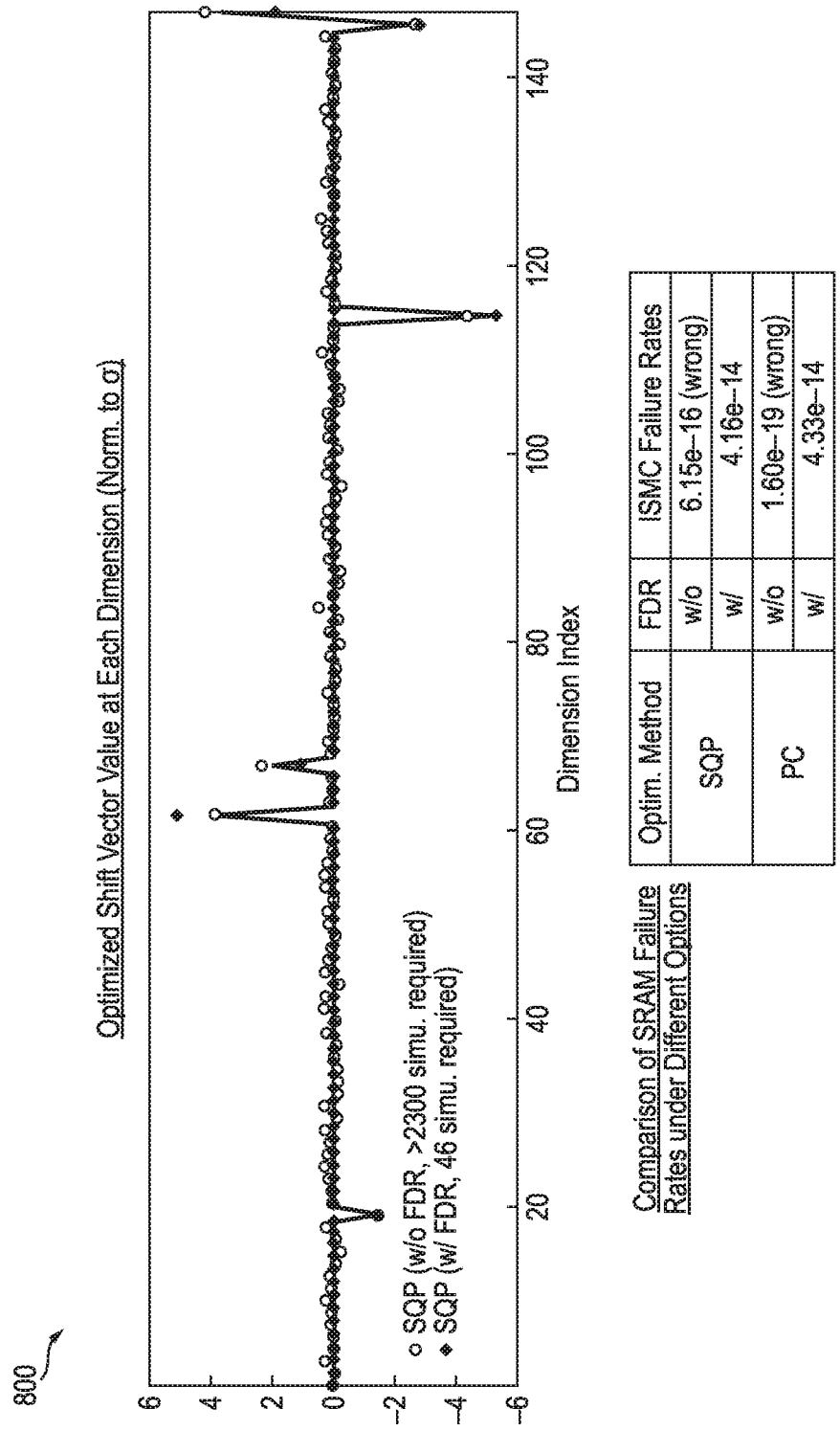
FIG. 8, depicts results of an analysis of an SRAM array write failure, and depicts a comparison of importance sampling with dimension selection and IS without dimension selection, according to an embodiment of the present disclosure.

FIG. 8, depicts results of an analysis of an SRAM array write failure, and depicts a comparison of importance sampling with dimension selection and IS without dimension selection, according to an embodiment of the present disclosure.

Referring to FIG. 8, in the filter-based dimension reduction of the present example, principal dimensions are chosen, and all of the principal dimensions are classified as causing "high-sigma tail" failure types. Both probability-collective (PC) and sequential quadratic programming (SQP)-based gradient search methods have been adopted to optimize IS function, which show comparative performance and much more improvement than without filter-based dimension reduction results.

As shown in the present example, without dimension selection, there are very low results. However, with dimension selection, very reasonable results are returned.

Figure 9:
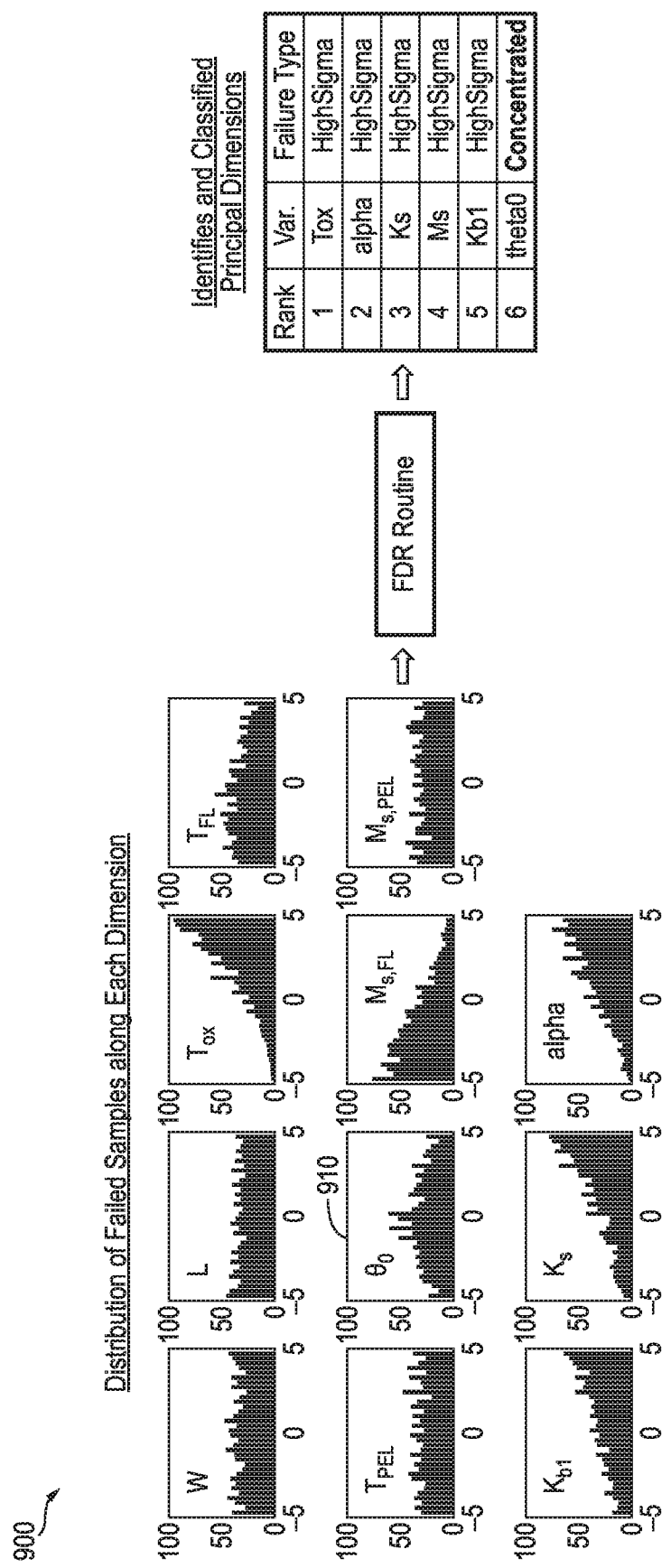
FIG. 9 depicts STT-MRAM write-error-rate analysis, according to an embodiment of the present disclosure.

FIG. 9 depicts STT-MRAM write-error-rate analysis, according to an embodiment of the present disclosure.

Referring to FIG. 9, spin-transfer torque magnetic random-access memory (STT-MRAM) is an emerging nonvolatile memory having advantages such as low power, small form factor and high endurance, etc. However, besides the process variability, due to its quantum mechanical nature, the initial magnetization angle ($\theta_0$) variability 910 causes switching failures, which may warrant studying during STT-MRAM device and circuit designs. Unlike other variability source-caused "high-sigma tail" failures, $\theta_0$ 910 will generally introduce a "concentrated" failure region around its mean (zero), unlike other dimensions shown in the chart 900. By using proposed filter-based dimension reduction, all critical dimensions and their caused failure types can be detected and classified.

In the present example, only a single cell is tested, noting that a large number of dimensions correspond to the single tested cell. That is, there may be a lot of process variability including geometry of material parameters affecting performance of the device (e.g., device parameters of the tested cell). In a manner similar to the example shown in FIG. 7, some of the dimensions depict a relatively uniform distribution of the failed samples, while other dimensions generate a single-sided failure sample distribution (e.g., a fail sample corresponding to high-sigma tails).

Furthermore, in the present example, a $\theta_0$ dimension is depicted as even symmetric in function time. Accordingly, the failed samples in the $\theta_0$ dimension appear near a nominal case of zero within a very narrow region. Contrastingly, standard sampling (e.g., series sigma sampling) may fail to capture a large number of samples in the region corresponding to the near nominal case, thereby failing to provide accurate results of overall failure rates due to the insufficient number of samples in that region.

Accordingly, once the $\theta_0$ dimension is detected, the $\theta_0$ dimension can be classified into a concentrated fail case (e.g., S230). Then, optimization may be applied only within that window (e.g., S240), such that a sampling center of deviation may be optimized only within that window, thereby enabling concentrated sampling such that rare failure events, which are not in the high-sigma tails, may be evaluated. Accordingly, the $\theta_0$ dimension concentrates the failure time, and contributes to intrinsic device failure rates.

Figure 10:
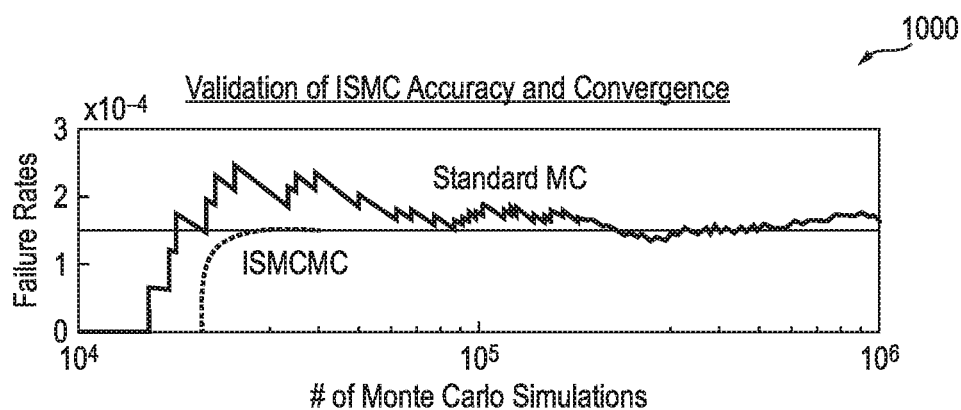
FIG. 10, depicts validation of ISMC accuracy and convergence according to an embodiment of the present disclosure and according to a comparative example.
Figure 11:
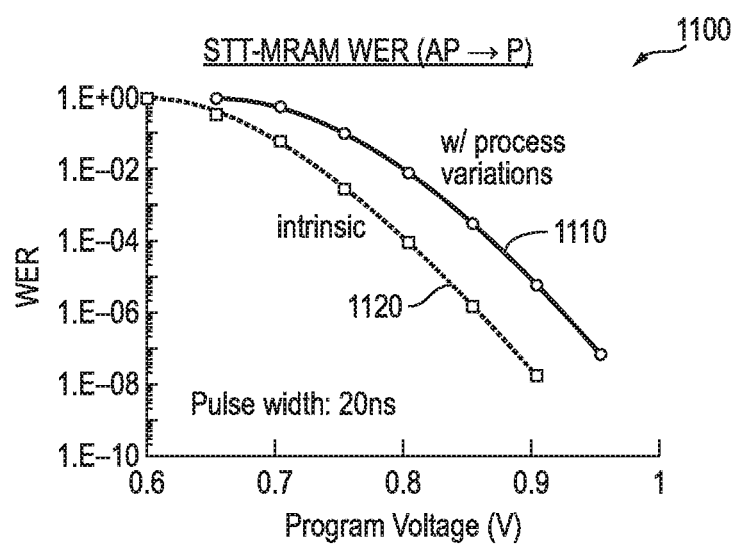
FIG. 11 depicts an STT-MRAM write-error-rate, according to an embodiment of the present disclosure.

FIG. 10 depicts validation of ISMC accuracy and convergence according to an embodiment of the present disclosure and according to a comparative example, and FIG. 11 depicts an STT-MRAM write-error-rate, according to an embodiment of the present disclosure.

Referring to FIG. 10, as can be seen is the comparison 1000 of a standard MC analysis of the comparative example 1010 to the ISMC of the present embodiment, shows significant improvement of simulation convergence and accuracy is achieved by the present embodiment when compared to the standard MC method.

The results obtained in the present example of the present embodiment of the disclosure shows highly consistent failure rate estimation when compared with a standard MC simulation. That is, IS according to the present embodiment saves simulation time/evaluation time given a constant sampling budget. Contrastingly, for standard MC simulation, over a million samples may be needed to get the failure events of 1.E-04. Furthermore, to simulate a more rare event (e.g., 1.E-06), it may be necessary to draw as many as $10^9$ samples, which is generally not very practical.

However, for the modified IS approach according to the present embodiment, as few as 10,000 samples can be used while still attaining the same accuracy level. Also, based on the curve it shows here, it shows more robust compared with brute force among column mention.

Furthermore, referring to FIG. 11, the simulated WER 1100 shows the impacts from both process variability 1110 as well as that from initial magnetization angle variability 1120, thereby providing guidelines for engineering STT-MRAM device and large-scale arrays.

Accordingly, as demonstrated above, efficiency as well as accuracy is improved by the described embodiments. Further, as shown in FIG. 11, because a more limited number of samples is able to be effectively used with the disclosed embodiments, both intrinsic variations, or intrinsic failure rates, as well as failure rates caused by process variations, may be generated.

According to the disclosed embodiments, by implementing a filter-based dimension reduction, which may be accomplished by transforming a probability density function and classifying failure types of each dimension based on the implemented transform, accuracy of circuit yield analysis is improved while evaluation time is reduced for importance sampling.

What is claimed is:

1. A method of circuit yield analysis for evaluating rare failure events, the method comprising:
    performing initial sampling to detect failed samples respectively located at one or more failure regions in a multi-dimensional parametric space;
    generating a distribution of failed samples at discrete values along each dimension of the parametric space;
    performing a transform-based filtering operation on the distribution of failed samples at each dimension, via a discrete cosine transform (DCT), discrete sine transform (DST), or a discrete Fourier transform (DFT), to project the failed samples into all dimensions in a transform space; and
    classifying a type of failure region for each dimension in the parametric space by evaluating one or more transform coefficients of the transform-based filtering operation.

2. The method of claim 1, further comprising iteratively optimizing an importance sampling (IS) function to suppress unwanted impacts of each of the dimensions by dimension reduction.

3. The method of claim 2, wherein a method of the optimizing corresponds to the type of failure region.

4. The method of claim 2, further comprising determining whether convergence to rare failure rates occurs as a result of the optimizing of the IS function; and
    further iteratively optimizing the IS function until the convergence occurs.

5. The method of claim 4, further comprising performing importance sampling monte carlo (MC) to calculate a failure rate of an analyzed circuit.

6. The method of claim 1, wherein the classifying comprises determining which of the dimensions is important based on signatures of the dimensions in the transform space.

7. The method of claim 1, wherein the classifying comprises evaluating a second transform coefficient and a third transform coefficient of the transform-based filtering operation corresponding to the failed samples.

8. The method of claim 7, wherein the classifying comprises determining which of the second transform coefficient and the third transform coefficient is larger, wherein the type of failure region is classified as a high-sigma failure type when the second transform coefficient is larger, and wherein the type of failure region is classified as a concentrated failure type when the third transform coefficient is larger.

9. A system for circuit yield analysis for evaluating rare failure events, the system comprising:
a processor; and
a memory having instructions stored thereon that, when executed by the processor, cause the processor to
perform initial sampling to detect failed samples respectively located at one or more failure regions in a multi-dimensional parametric space;
generate a distribution of failed samples at discrete values along each dimension of the parametric space;
perform a transform-based filtering operation on the distribution of failed samples at each dimension, via a discrete cosine transform (DCT), discrete sine transform (DST), or a discrete Fourier transform (DFT), to project the failed samples into all dimensions in a transform space; and
classify a type of failure region for each dimension in the parametric space by evaluating one or more transform coefficients of the transform-based filtering operation.

10. The system of claim 9, wherein the instructions, when executed by the processor, further cause the processor to iteratively optimize an importance sampling (IS) function to suppress unwanted impacts of each of the dimensions by dimension reduction.

11. The system of claim 10, wherein the instructions, when executed by the processor, cause the processor to iteratively optimize the IS function according to a classified type of failure region.

12. The system of claim 10, wherein the instructions, when executed by the processor, further cause the processor to:
determine whether convergence to rare failure rates occurs as a result of optimizing the IS function; and
further iteratively optimize the IS function until the convergence occurs.

13. The system of claim 12, wherein the instructions, when executed by the processor, further cause the processor to perform importance sampling MC to calculate a failure rate of a circuit.

14. The system of claim 9, wherein the instructions, when executed by the processor, cause the processor to classify the type of failure region by determining which of the dimensions is important based on signatures of the dimensions in the transform space.

15. The system of claim 9, wherein the instructions, when executed by the processor, cause the processor to classify the type of failure region by evaluating a second transform coefficient and a third transform coefficient of the transform-based filtering operation corresponding to the failed samples.

16. The system of claim 15, wherein the instructions, when executed by the processor, cause the processor to classify the type of failure region by determining which of the second transform coefficient and the third transform coefficient is larger,
wherein the type of failure region is classified as a high-sigma failure type when the second transform coefficient is larger, and
wherein the type of failure region is classified as a concentrated failure type when the third transform coefficient is larger.

17. A method of circuit yield analysis for evaluating rare failure events, the method comprising:
performing a transform-based filtering operation on an initial number of simulated samples, via a discrete cosine transform (DCT), discrete sine transform (DST), or a discrete Fourier transform (DFT), to indicate a number of variability dimensions corresponding to an analyzed circuit;
based on the transform-based filtering operation, detecting ones of the variability dimensions having failed samples;
classifying a failure type of each of the ones of the variability dimensions having failed samples by evaluating one or more transform coefficients of the transform-based filtering operation; and
based on the classifying, iteratively optimizing an importance sampling function for each of the ones of the variability dimensions having failed samples.

18. The method of claim 17, wherein a method of the optimizing corresponds to the failure type.

* * * * *